United States Patent [19]
Ben-Michael et al.

[11] Patent Number: 5,720,893
[45] Date of Patent: Feb. 24, 1998

[54] TAPERED BEAM EXPANDER WAVEGUIDE INTEGRATED WITH A DIODE LASESR

[75] Inventors: Rafael Ben-Michael, Eatontown; Uziel Koren, Fair Haven, both of N.J.

[73] Assignee: Lucent Technologies Inc., Murray Hill, N.J.

[21] Appl. No.: 641,607

[22] Filed: May 1, 1996

Related U.S. Application Data

[62] Division of Ser. No. 250,876, May 31, 1994, Pat. No. 5,574,742.

[51] Int. Cl.$^6$ .................................................. H01L 21/00
[52] U.S. Cl. ................................ 216/24; 216/2; 216/41
[58] Field of Search ............................... 216/2, 24, 41; 156/649.1, 659.11, 661.11; 372/45

[56] References Cited

U.S. PATENT DOCUMENTS

| | | | |
|---|---|---|---|
| 4,932,032 | 6/1990 | Koch et al. | 372/45 |
| 5,078,516 | 1/1992 | Kapon et al. | 385/129 |
| 5,121,182 | 6/1992 | Kuroda et al. | 357/30 |
| 5,260,822 | 11/1993 | Missaggia et al. | 359/337 |
| 5,434,973 | 7/1995 | Dentai et al. | 385/129 |

FOREIGN PATENT DOCUMENTS

| | | | |
|---|---|---|---|
| 58-114476 | 7/1983 | Japan | H01S 3/18 |
| 4180686A | 6/1992 | Japan | H01S 3/18 |

OTHER PUBLICATIONS

Y. Shani et al., "Efficient Coupling of a Semiconductor Laser to an Optical Fiber by Means of a Tapered Waveguide on Silicon," *Applied Phys. Letters*, vol. 55, No. 23, Dec. 4, 1989, pp. 2389-2391. Technological background of the invention.

R. Zengerle et al., "Low-Loss Fibre-Chip Coupling by Buried Laterally Tapered InP/InGaAsP Waveguide Structure," *Electronics Letters*, vol. 28, No. 7, Mar. 26, 1992. Technological background of the invention.

T. L. Koch et al., "Semiconductor Photonic Integrated Circuits," *IEEE Journal of Quantum Electronics*, vol. 27, No. 3, Mar. 1991, pp. 641-645. Technological background of the invention.

M. Chein et al., "Short-Cavity Distributed Bragg Reflector Laser with an Integrated Tapered Output Waveguide," *IEEE Photonics Technology Letters*, vol. 3, No. 5, May 1991, pp. 418-420. Technological background of the invention.

U. Koren et al., "Tapered Waveguide InGaAs/InGaAsP Multiple-Quantum-Well Lasers," *IEEE Photonics Technology Letters*, vol. 2, No. 2, Feb. 1990, pp. 88-90. Cited by Examiner in parent application.

G. Bendelli et al., "A New Structure for High-Power TW-SLA," *IEEE Photonics Technology Letters*, vol. 3, No. 1, Jan. 1991, pp. 42-44. Cited by Examiner in parent application.

*Primary Examiner*—William Powell

[57] ABSTRACT

The present invention is directed to a semiconductor waveguiding structure which includes a) a first semiconductor waveguiding layer formed on a substrate, b) a barrier layer that is formed on the first semiconductor waveguiding layer, and that is resistant to a selected etchant, and c) a second semiconductor waveguiding layer that is etched using the selected etchant such that its width is tapered along its length to a pointed edge. A separate etching of the first semiconductor layer is performed to form each sidewall of the first semiconductor layer. The intersection of those sidewalls defines the pointed edge which has a radius of curvature of less than 500 Angstroms.

5 Claims, 6 Drawing Sheets

5,720,893

TAPERED BEAM EXPANDER WAVEGUIDE INTEGRATED WITH A DIODE LASESR

This is a division of application Ser. No. 08/250,876 filed May 31, 1994, now U.S. Pat. No. 5,574,742.

TECHNICAL FIELD

This invention relates to semiconductor devices and, more particularly, to devices incorporating optical waveguiding structures.

BACKGROUND OF THE INVENTION

Because of the relatively high energy loss that typically results from the coupling or aligning of a diode laser to an optical fiber, multiple solutions have been proposed over the years to facilitate efficient transfer of electromagnetic energy, such as lightwave signals, from a laser to an optical fiber. The importance of this problem is underscored by the fact that in conventional lasers, for example, a half micron vertical displacement of an optical fiber results in more than half of the light being lost. Additional impetus to improve the coupling or aligning process has been provided recently by the increasing use of optical systems and circuits in various devices that are in great demand in multiple industries.

Among the numerous proposed solutions to the aligning problem, waveguides that use tapered semiconductor structures appear to minimize loss between a diode laser and a fiber optic cable when those waveguides are placed therebetween. One of the better known tapering structures for semiconductor waveguides is the staircase tapering structure that is disclosed in U.S. Pat. No. 4,932,032 issued Jun. 5, 1990 to T. Koch and U. Koren. While the staircase structure offers many advantages, a significant amount of light beam is still lost within the structure and its fabrication process requires a sequence of lithographic and etching procedures for each step in the staircase.

In an attempt to remedy some of the limitations associated with the staircase tapering method, continuous tapering arrangements for waveguide have been recently developed. Shani et al. in an article published in Appl. Phys. Lett., Vol. 55, No. 23, pp. 2389–2391, proposed a system in which, continuous tapering is achieved by placing different layers of glass between the fiber and the semiconductor laser, thereby allowing the layers of glass to act as a lens or an adapter. However, in the Shani et al. system, because the devices are not integrated, two different aligning steps are required, namely, aligning the laser to the glass waveguide, and aligning the glass waveguide to the fiber.

Another continuous tapering device is disclosed by Zengerle et al. in an article published in Electron. Lett., Vol. 27, pp. 1836–1838, 1991. In the Zengerle et al. waveguide device, tapering is achieved by a) continuously tapering down one layer of semiconductor material and b) continuously tapering up another layer of a different semiconductor material. However, one of the problems with the Zengerle et al. waveguide device is that it cannot be integrated with a laser. Furthermore, the same alignment problems experienced with the Shani et al. device will apply to the Zengerle et al. device as well.

Thus, a problem of the prior art is that the stand-alone waveguide devices have significant alignment problems and are not readily adaptable for use inside a laser cavity. Furthermore, for some important applications, beams of light generated by prior an integrated devices are still not narrow enough for optimal coupling to a fiber optic cable.

SUMMARY OF THE INVENTION the present invention is directed to a semiconductor waveguiding structure which includes a) a first semiconductor waveguiding layer formed on a substrate, b) a barrier layer that is formed on the first semiconductor waveguiding layer, and that is resistant to a selected etchant, and c) a second semiconductor waveguiding layer that is etched using the selected etchant such that its width is tapered along its length to a pointed edge.

In a preferred embodiment of the invention, the tapering of the second semiconductor waveguiding layer is achieved by performing a set of etching and photolithographic procedures on that layer. Specifically, a first mask is deposited on a selected area of the second semiconductor waveguiding layer. Subsequently, the area of the second semiconductor waveguiding layer left unprotected by the first mask is etched to create a first sidewall. Thereafter, the first mask is removed and a second mask is applied on a selected portion of the remaining area of the second semiconductor waveguiding layer such that an edge of the second mask intersects the first sidewall. Then, the area of the second semiconductor waveguiding layer left unprotected by the second mask is etched to define a second wall intersecting the first sidewall to form a pointed edge with a radius of curvature of less than 500 Angstroms,

DETAILED DESCRIPTION

FIGS. 1–7 are not drawn to scale and are presented in their current form for illustrative purposes. For example, in FIG. 2, the mask that is deposited on section 16 of layer 12 may be ten to 20 times thicker than any of the layers 11, 12, 13 and 14.

Figure 1:
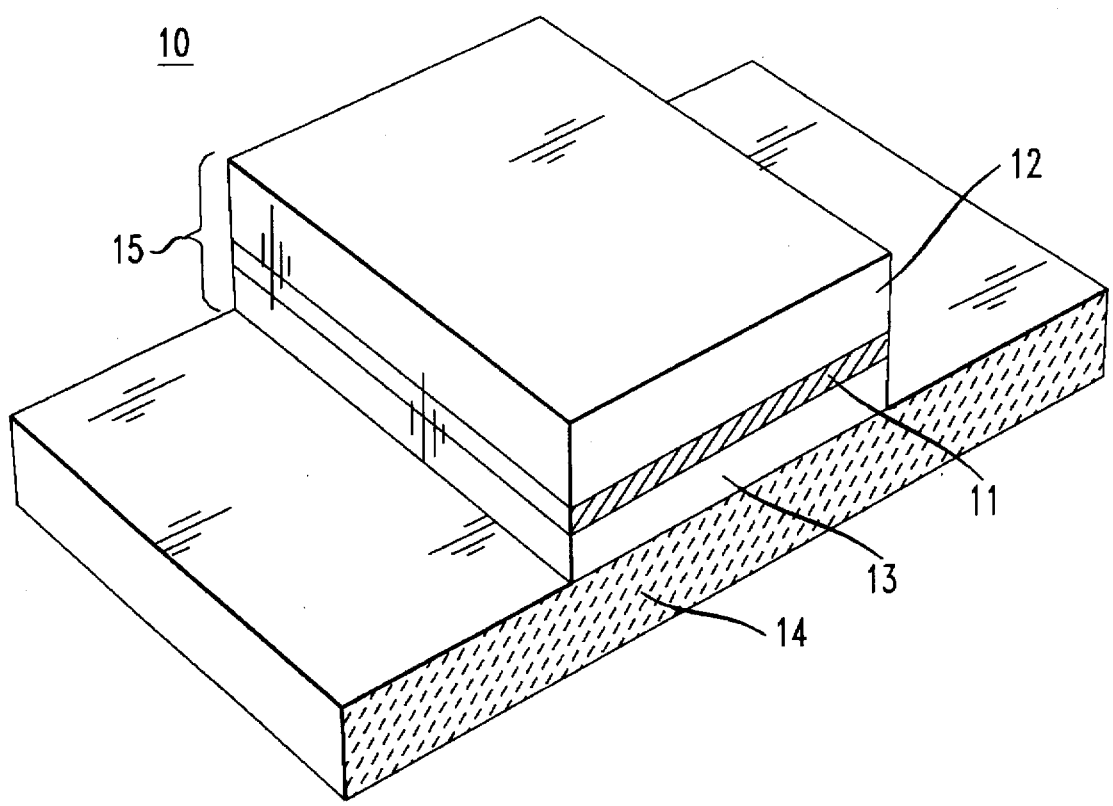
FIGS. 1 through 5 show a sequence of procedures that may be used to design a continuously tapered waveguide according to the principles of the invention.

FIG. 1 shows a three-dimensional view of a structure 10 that is comprised of a stop-etch (barrier) layer 11 interleaved between two semiconductor waveguiding layers 12 and 13. The stop-etch layer 11 is made of particular semiconductor materials that have the desirable characteristic of being etch-proof to particular chemical components or other processes that can etch the guiding layers 12 and 13. For example, the stop-etch layer 11 can be made of indium phosphite (InP) material which is known for its attribute of not being etched or altered by selective etchants, such as mixtures of sulfuric acid, hydrogen peroxide, and deionized water. By contrast, when the same etchants are applied on the guiding layers 12 and 13, they selectively etch those layers to carve out a desired shape. These etchants are particularly effective when the guiding layers are made of indium gallium arsenide phosphite (InGaAsP) material. Thus, the stop-etch layer 11 permits, for example, upper guiding layer 12 to be chemically etched while leaving the underlying guiding layer 13 intact, notwithstanding the close proximity of layers 12 and 13. It is also worth noting that although both guiding layers may be made of the same material, such as InGaAsP, the composition of the chemical elements in these layers may be different to effect the refractive index of each one of these layers. It is also to be understood that although in this example, the guiding layers are made of InGaAsP materials, other kind of materials selected from the Group III–V of the periodic table may be used as Well for the guiding layers.

Rib 15 is comprised of layers 12, 11 and 13. Rib 15 may be formed using for example, prior an photolithographic process and etching process. As is well known to those skilled in the art, a rib can be formed by masking specific sections of an upper layer, and by etching and removing one or more layers of materials purposely left exposed in the course of that photolithographic process. In this example, the etchant allowed the etching and removal of exposed sections (not shown) of layers 12, 11 and 13. These exposed sections extended to the edge of cladding layer 14 described below. Myers 12, 11 and 13 were covered by a mask to prevent the etchant from affecting those layers.

Also shown in FIG. 1 is a bottom cladding layer 14. As is well-known in the art, a cladding layer has a lower refractive index than immediately adjacent layers and, thus, operates to confine light traversing these layers mostly to those adjacent layers. Optionally, structure 10 may include one or more cladding layers placed on top of guiding layer 12 and below guiding layer 13. Structure 10 may be fabricated using well-known techniques, such as standard molecular beam epitaxy, vapor phase epitaxy, or Metal Organic Chemical Vapor Deposition (MOCVD). Further information on MOCVD and other fabrication techniques is provided in AT&T Technical/Journal, Vol. 68, No. 1 (January/February 1989).

Of particular importance in the structure of FIG. 1 is the fact that the thickness of waveguiding layers 12 and 13 is selected or determined by using precise epitaxial growth techniques such as the ones mentioned above. The use of these methods for selecting the thickness of layers 12 and 13 results in precise control over the expansion of the optical beam (as explained in further detail below) thereby permitting very narrow far field divergence angles to be obtained. No techniques of the prior an have been able to match the narrowness of those angles.

Figure 2:
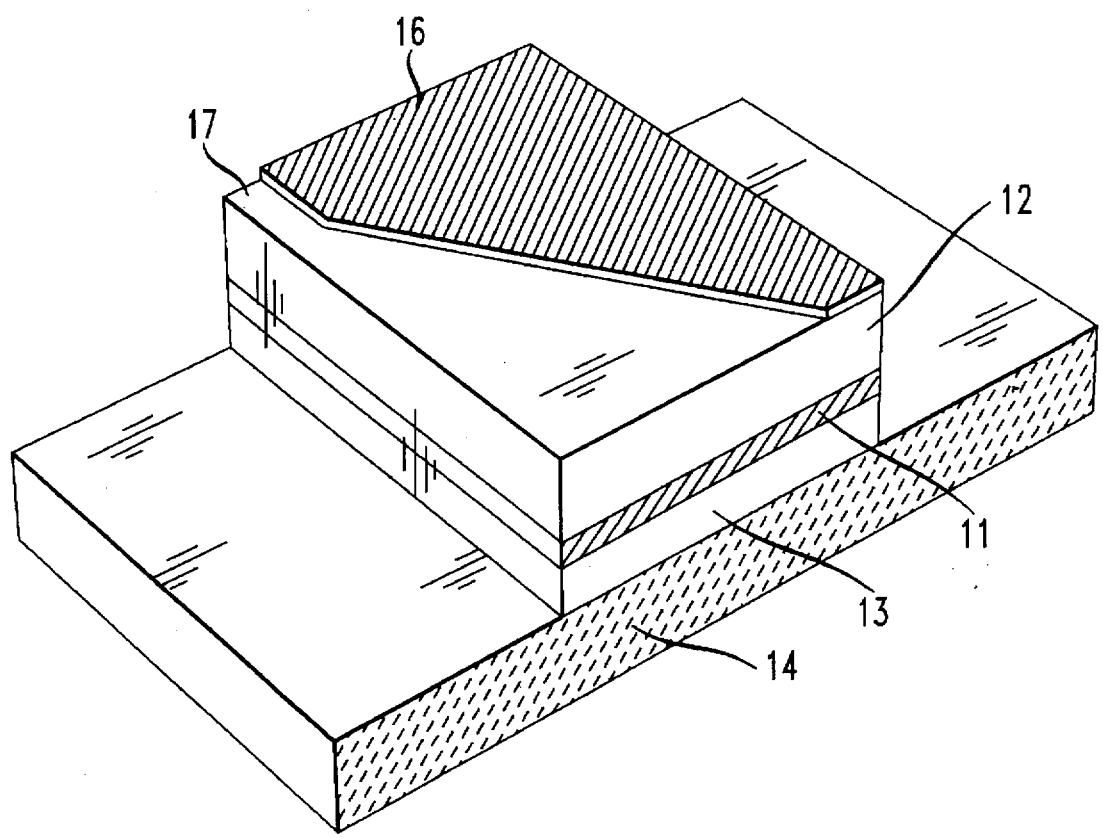

FIG. 2 shows a three-dimensional view of rib 15, after a first "knife-edge" like mask has been deposited on a selected section of layer 12. Shown in FIG. 2 is an area represented by unmasked section 17 and a shaded area representing masked section 16. Section 17 is purposely left exposed in the course of a photolithographic process to enable the etching of section 17 of layer 12.

Figure 3:
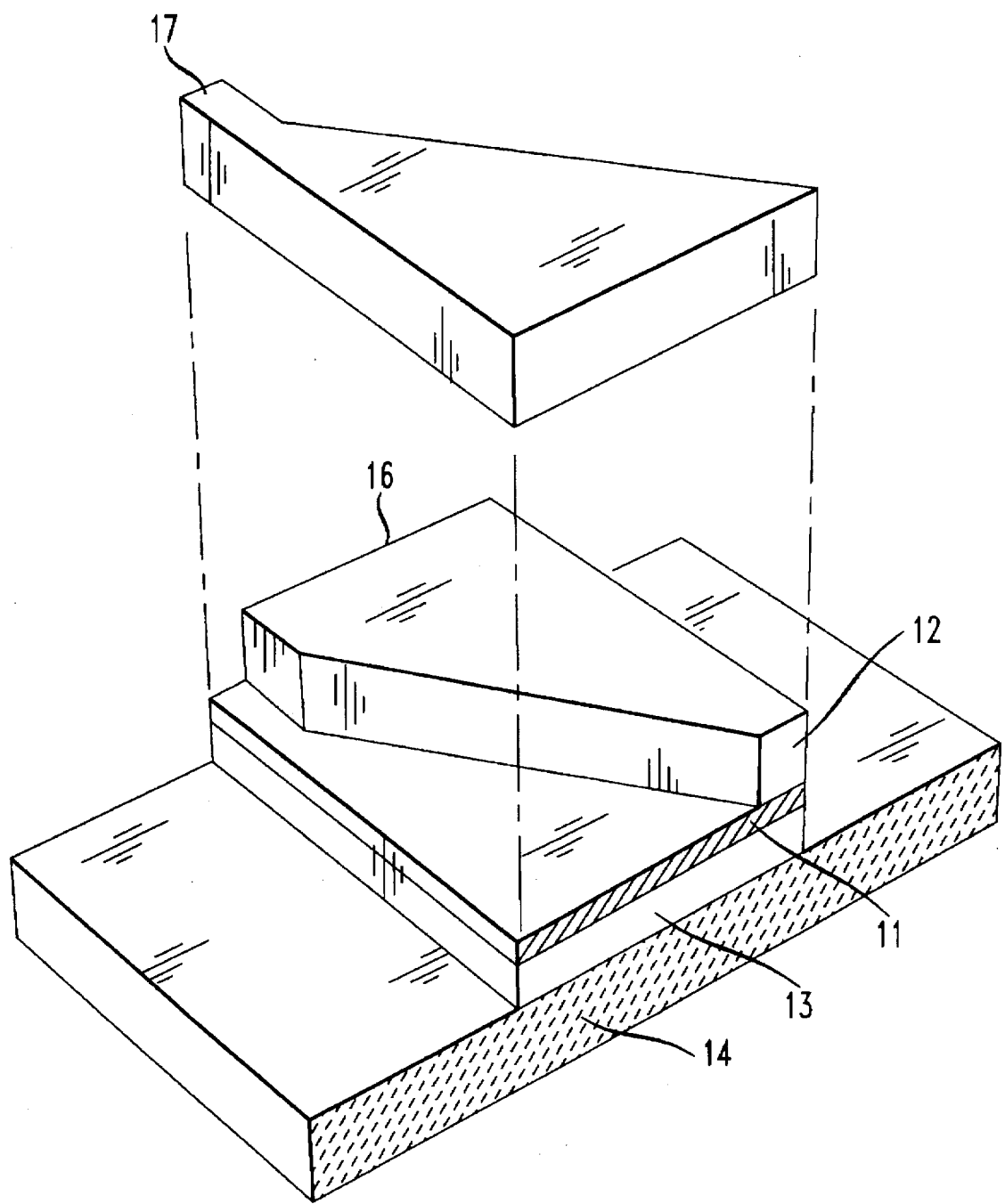
Figure 4:
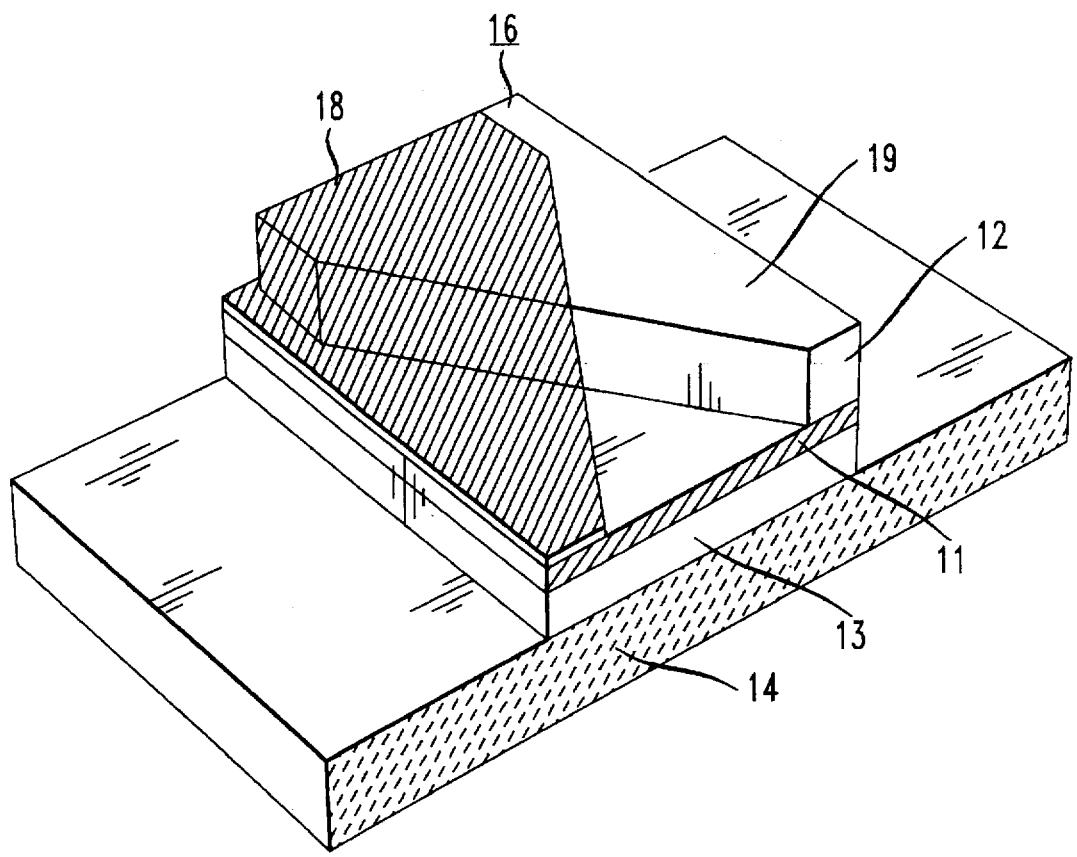

FIG. 3 shows an a three-dimensional exploded view of the unmasked section 17 of layer 12 and the rest of semiconductor waveguiding structure 10. After an etchant is deposited on layer 12, the exposed section 17 is etched away to leave only section 16 as the remaining area of layer 12. Subsequently, as shown in FIG. 4, a knife-edge mask is applied to the shaded area 18 of section 16, thereby leaving section 19 exposed. An etchant is again deposited on layer 12 to etch away section 19 from layer 12. As a result of the etching of section 19, waveguiding layer 12 is now reduced to the area shown in FIG. 5 as section 20. It is worth noting that the waveguiding layer 13 is unaffected by the aforementioned sequential masking and etching processes. This is due to the fact that the barrier layer 11 acted as a shield that protected the waveguiding layer 13 from the etchant's chemical effects. Although not shown in FIG. 5, additional cladding material may be epitaxially grown around and above the sidewalls of the structure of FIG. 5.

Figure 5:
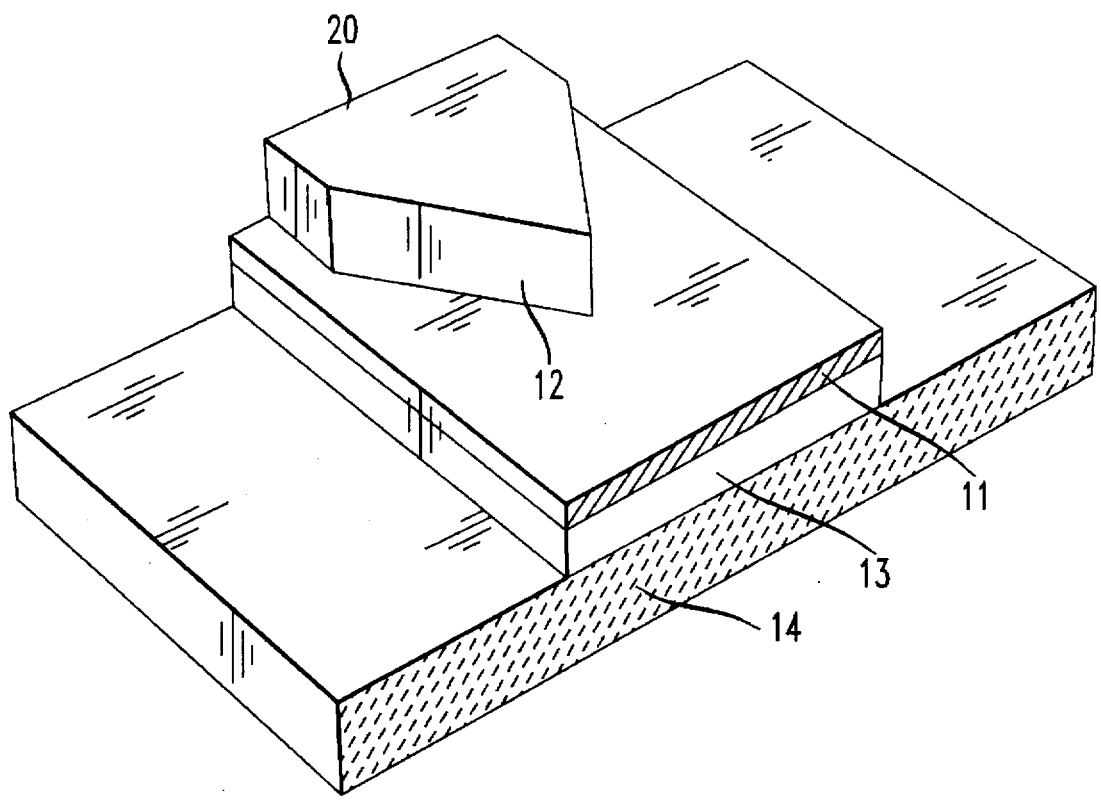

Of particular importance in FIG. 5 is the physical shape of the remaining section 20 of upper waveguiding layer 12 that resulted from the aforementioned sequential photolithographic and etching processes. Layer 12 is now wedge-shaped and is formed by two opposing sidewalls intersecting in such a way as to define a pointed edge at their intersection. It is worth noting that although the sidewalls of the upper layer 12 are illustratively shown as straight and/or oblique in the three-dimensional view of FIG. 5, it is to be understood that those sidewalls may be convex and/or non-oblique so long as a narrow termination edge is defined at the intersection of those sidewalls.

Advantageously, the sequential etching process of the invention vitiates an inherent deficiency of prior art photolithographic procedures, namely the difficulty in creating a single mask in order to taper a layer down to a very small size. Specifically, the sequential etching process of the invention significantly minimizes the "rounding" of the pointed edge that is caused in the prior art techniques by the undercutting of a single mask by an etchant. A radius of curvature of less than 500 Angstroms has been measured for a pointed edge created by the sequential etching process of the invention. The effect of the narrow pointed edge of the taper is to significantly reduce the loss of light in the waveguiding Structure of FIG. 5.

Equally important is the thickness of layers 12 and 13 which can be selected before the etching process described in FIGS. 3–4 to affect the lateral and vertical expansion of a lightbeam propagated through the waveguiding structure of FIG. 5.

Figure 6:
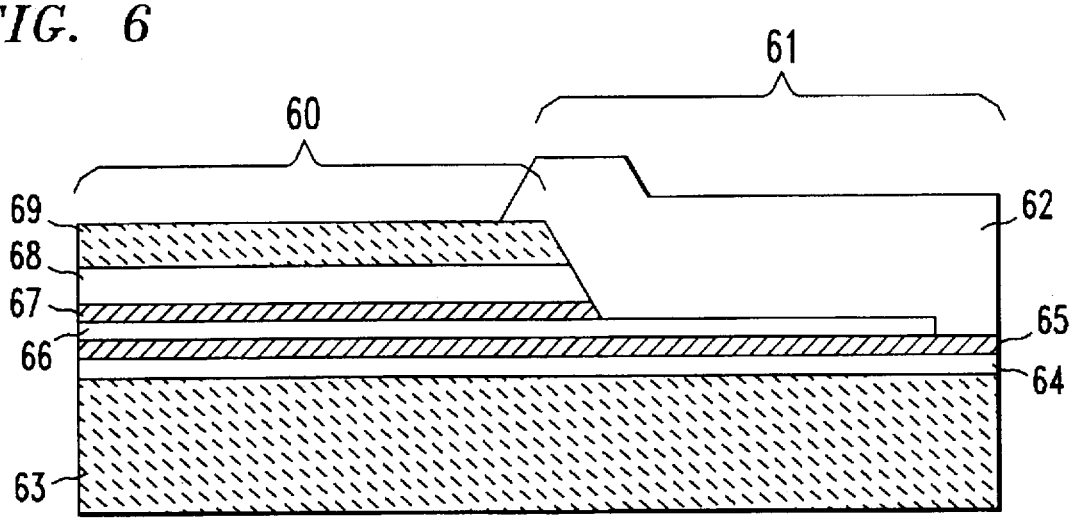
FIGS. 6 and 7 depict a side view and a top view, respectively, of an integrated device which includes the waveguiding structure of FIG. 5 placed in a laser cavity.

FIG. 6 depicts a cross-sectional view of an integrated device which includes the waveguiding structure of FIG. 5. Shown in FIG. 6 is a gain section 60 and a passive section 61 in which the waveguide of FIG. 5 is located. The gain section 60 is comprised of a cladding layer 69, whose refractive index is lower than the refractive index of the waveguiding layers therebelow. Underneath cladding layer 69 is a multiple quantum well 68, which generates a lightbeam when gain section 60 is excited or pumped by electrical current. Interleaved between the multiple quantum well 68 and the top guiding layer 66 is a stop-etch layer 67. Stop etch layer 67 prevents the etchants from impacting the top guiding layer during one or more etching processes. Another stop-etch layer 65, is interleaved between the bottom guiding layer 64 and the top guiding layer 66. The bottom guiding layer 64 is also surrounded by a bottom cladding layer 63.

It is worth noting that the bottom cladding layer 63, and guiding layers 66 and 64 are doped using n-type dopants, such as sulfur or silicone. Of particular significance is the fact that all the layers in the gain section 60 and the passive section 61 are grown together in a single growth step. The integrating device shown in FIG. 6 is the result of one or more etching processes in which section 62 was removed from the passive section 61 of the originally epitaxially grown structure. Specifically, the active layers in the laser section that are used to provide the optical gain are selectively removed in the passive section where the beam expander can be precisely defined. Thus, in FIG. 6, layers 66, 65, 64 and 63 represent extensions of layers 12, 11, 13 and 14, respectively, shown in the passive waveguiding region of FIG. 5. Advantageously, the integration of the guiding layers in the gain and passive regions vitiates any alignment issues between a diode laser and a passive waveguiding structure.

Figure 7:
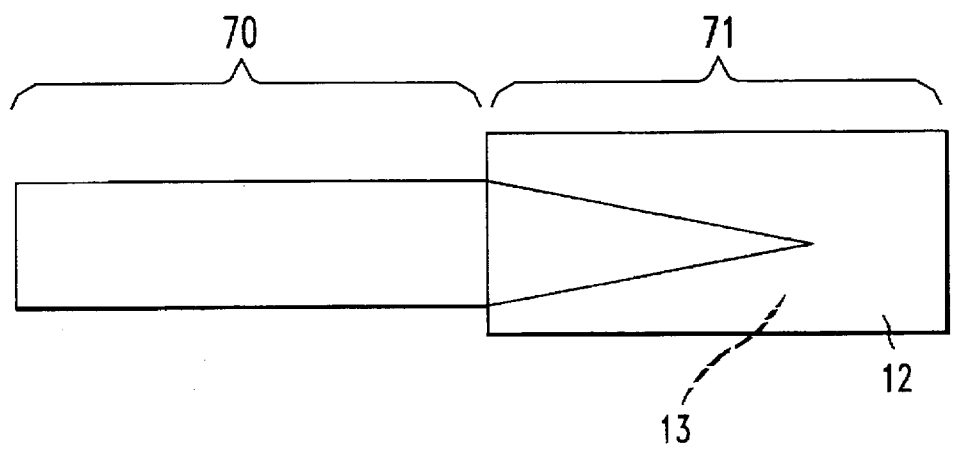

FIG. 7 shows a top view of the waveguiding structure of FIG. 6 when placed inside a laser cavity. The integrated device of FIG. 7 includes a gain section 70 and a passive waveguiding section 71. Gain section 70 is another representation of the diode laser 60 of FIG. 6, which may be implemented using, for example, a 2.5 micron wide mesa that is buried in semi-insulating, iron doped indium phosphide using MOCVD selective regrowth technique. The passive waveguiding section 71 expands a beam size both laterally and vertically, as the beam passes through the waveguiding section. In this example, the lateral broadening is due to the design of waveguiding section 71 which is wider than gain section 70. Vertical broadening is achieved by the gradual change from two guiding layers to one guiding layer, as the light travels from the entrance to the exit of the waveguiding section 71.

In order to examine the mode transformation of the integrated device of FIG. 6 or 7, the near- and far-field of the laser section solely, and of the integrated device were measured. The far field pattern of the laser section only was observed to be elliptical, with lateral Full Width at Half Maximum (FWHM) of 25 degrees, and vertical FWHM of 45 degrees. By contrast, the measured far field of the integrated device of FIG. 6 or 7 was observed to be almost circular symmetric, with an extremely narrow far field distribution. The lateral far-field FWHM angle for the integrated device of FIG. 6 or 7 was measured to be only 5 degrees, while then perpendicular angle was measured to be only 7 degrees.

Advantageously, the integrated device of FIG. 6 or 7 allows a significant increase in threshold current and improved quantum efficiency, compared to prior art devices. Furthermore, the integrated device of FIG. 6 or 7 is extremely tolerant for misalignment to an optical fiber and shows extremely narrow far field pattern for beams generated therein. For example, threshold current of 12 mA, and external quantum efficiency of 15% out of the waveguide facet have been measured for the integrated device of FIG. 6 or 7. Coupling efficiency to a cleaved single mode optical fiber was also measured at 44% (−3.5 dB).

The foregoing is to be construed as only being an illustrative embodiment of this invention. Persons skilled in the art can easily conceive of alternative arrangements providing functionality similar to this embodiment, without any deviation from the fundamental principles or the scope of this invention.

We claim:

1. In a semiconductor waveguiding structure which includes a) a first semiconductor waveguiding layer mounted on a substrate, b) an etch-resistant barrier layer formed on the first waveguiding layer, and c) a second semiconductor waveguiding layer formed on the barrier layer, a method of fabricating a tapered semiconductor waveguiding structure, the method comprising the steps of:

depositing a first mask on a first portion of the second semiconductor waveguiding layer;

etching a first section of the second semiconductor waveguiding layer unprotected by the first mask to create a first sidewall;

removing the first mask;

applying a second mask on part of the first portion and a second portion of the second semiconductor waveguiding layer such that an edge of the second mask intersects the first sidewall;

etching a second section of the second semiconductor waveguiding layer unprotected by the second mask to define a second wall intersecting the first sidewall to form a pointed edge.

2. The invention of claim 1 wherein, from a top view of the second semiconductor waveguiding layer, at least one of the sidewalls is slanted upwards.

3. The invention of claim 1 wherein, from a top view of the second semiconductor waveguiding layer, at least one of the sidewalls is slanted downwards.

4. The invention of claim 1 wherein, from a top view of the second semiconductor waveguiding layer, at least one of the sidewalls is slanted upwards and the other sidewall is slanted downwards.

5. The invention of claim 1 wherein at least one of the sidewalls is convex.

\* \* \* \* \*